United States Patent
Teo et al.

(10) Patent No.: US 6,306,721 B1
(45) Date of Patent: Oct. 23, 2001

(54) METHOD OF FORMING SALICIDED POLY TO METAL CAPACITOR

(75) Inventors: Yeow Meng Teo; Madhusudan Mukhopadhyay; Heng Jee Kiat, all of Singapore (SG)

(73) Assignee: Chartered Semiconductor Maufacturing Ltd., Singapore (SG)

( * ) Notice: Subject to any disclaimer, the term of this patent is extended or adjusted under 35 U.S.C. 154(b) by 0 days.

(21) Appl. No.: 09/808,926

(22) Filed: Mar. 16, 2001

(51) Int. Cl.[7] .................................................. H01L 21/20
(52) U.S. Cl. ..................... 438/396; 438/398; 438/254; 438/682
(58) Field of Search ..................................... ; H01L 21/20

(56) References Cited

U.S. PATENT DOCUMENTS

| | | | |
|---|---|---|---|
| 5,641,702 | 6/1997 | Imai et al. | 438/396 |
| 6,110,791 | 8/2000 | Kalnitsky et al. | 438/379 |
| 6,124,199 | 9/2000 | Gambino et al. | 438/622 |
| 6,140,200 | 10/2000 | Eldridge | 438/396 |
| 6,143,618 | 11/2000 | Chen et al. | 438/396 |

OTHER PUBLICATIONS

Yaung et al., "Narrow Width Effects of Botton Gate Polysilicon Thin Film Transistors", 1998 IEEE, vol. 19, No. 11, pp. 429–431, Nov. 1998.*

* cited by examiner

Primary Examiner—Charles Bowers
Assistant Examiner—Yennhu B. Huynh
(74) Attorney, Agent, or Firm—George O. Saile; Rosemary L. S. Pike (57) ABSTRACT

A new method is provided for the creation of a salicided polysilicon capacitor. A salicided layer of polysilicon is created as the lower plate of a salicided polysilicon capacitor over the surface of a field isolation region. A layer of silicon nitride is deposited over the field oxide isolation region including the surface of the salicided polysilicon layer. A layer of TEOS is deposited over the surface of the layer of silicon nitride, a layer if titanium nitride is deposited over the surface of the layer of TEOS. The layer of TiN is etched after which the layer of TEOS is etched. The etch of the layer of TEOS is an overetch whereby TEOS is symmetrically removed from underneath the etched layer of TiN, leaving remnants of TEOS in place underneath the etched layer of TiN while at the same time creating air gaps underneath the etched layer of TiN. A layer of silane based oxide is deposited over the surface of the field oxide isolation region including the surface of the etched layer of TiN, thus enclosing the air gaps that have been created underneath the etched layer of TiN. The latter layer of silane based oxide is patterned and etched, forming the upper plate of the salicided polysilicon capacitor. The TEOS remnants remaining in place underneath the etched layer of TiN is part of the dielectric layer of the capacitor.

24 Claims, 4 Drawing Sheets

METHOD OF FORMING SALICIDED POLY TO METAL CAPACITOR

BACKGROUND OF THE INVENTION (1) Field of the Invention

The invention relates to the fabrication of integrated circuit devices, and more particularly, to a method of creating a capacitor that avoids problems of high etch selectivity and the presence of remnants of salicided material and that reduces the potential for shorts between the plates of the capacitor.

(2) Description of the Prior Art

The majority of the functions that are performed by semiconductor devices are functions of data manipulation or logic functions, these functions are mostly related to digital data manipulation but do not exclude the functions of analog data manipulation. Many of these functions depend on and make use of data retention, these data retention functions are performed by semiconductor memory devices. Two types of memory devices can be identified, that is memory functions that retain data in storage cells from which the data can only be read (Read Only Memories or ROM's) or memory functions whereby the data cannot only be read but can also be altered (Random Access Memories or RAM's).

The latter category of memory devices has been created using a number of different approaches, resulting in different types of RAM devices. Distinguished can be for instance the Dynamic RAM (DRAM), which uses capacitors as the storage medium and which are therefore, due to the non-permanent nature of capacitive storage, periodically refreshed, and the Static RAM (SRAM) which depends on the presence of a power source for the retention of the stored data. DRAM memories offer advantages of economy of construction and of relatively high storage capabilities and have therefore attracted a great deal of attention in the semiconductor industry. DRAM memory is typically created by creating a multiplicity of memory cells arranged in matrix form. Each cell comprises a storage capacitor and a gate electrode type transistor, which is connected in series with other memory cells of the DRAM cell configuration. Word lines and bit lines provide the functional capability of the DRAM memory cell, the transistor of the DRAM cell is connected to the word line while the bit lines are connected to a sense amplifier. The word lines and bit lines intersect under an angle of ninety degrees. The capacitive charge is accessed or read from the cell by activating the word line and the sense amplifier, which results in the capacitive charge to be read by the bit line of the CRAM cell. The capacitive charge is then further amplified by the sense amplifier, resulting in either a zero or a one voltage level provided by the sense amplifier.

One of the critical components in the creation of DRAM memory cells is the capacitor. Is it required that the capacitor has a high storage retention, is impervious to noise and does not require an excessive amount of surface area. To address these concerns, different arrangements have been proposed for the creation of the capacitor of a DRAM cell. One such arrangement provides a stacked capacitor. The memory cell under this arrangement comprises one transfer gate transistor and one stacked type capacitor. The transfer gate transistor comprises a pair of source/drain regions formed in a surface of a silicon substrate and a gate electrode (word line) that is formed on the surface of the silicon substrate with an insulation layer interposed therebetween. The stacked type capacitor comprises an underlying electrode (storage electrode) which extends from a position above the gate electrode to a position above a field isolation film, a part of the capacitor is connected to one of the source/drain regions of the gate electrode. A dielectric layer is formed on a surface of the underlying electrode and an upper electrode (cell plate) is formed on a surface of a dielectric layer. A bit line is formed on the capacitor with an interlayer insulation layer interposed therebetween, the bit line is connected to the other source/drain regions of the transfer gate transistor through a bit line contact portion. The stacked type capacitor is characterized in that capacitance of a capacitor is assured by providing the main part of the capacitor extending above the gate electrode and the field isolation film, this to increase an area where the electrodes of the capacitor are opposed to each other.

Another arrangement of a memory cell comprises a so-called cylindrical stacked type capacitor. A transfer gate transistor comprises a gate electrode (word line) with a periphery that is covered with an insulation layer. A word line with a periphery that is covered with the insulation layer is formed on the surface of a shield electrode which is formed on a surface of a silicon substrate with a shield gate insulation film interposed therebetween. An underlying electrode of the capacitor comprises a base portion (formed on a surface of an insulation layer covering surfaces of the gate electrode) and a word line with a cylindrical portion extending vertically and upwardly from the surface of the base portion in the form of a cylinder. A dielectric layer and an upper electrode are sequentially deposited on a surface of a lower electrode. The cylindrical portion of the capacitor can be used as a region for storing electric charges, enabling the capacitance of the capacitor to be increased without increasing the plane of the capacitor.

Figure 1A:
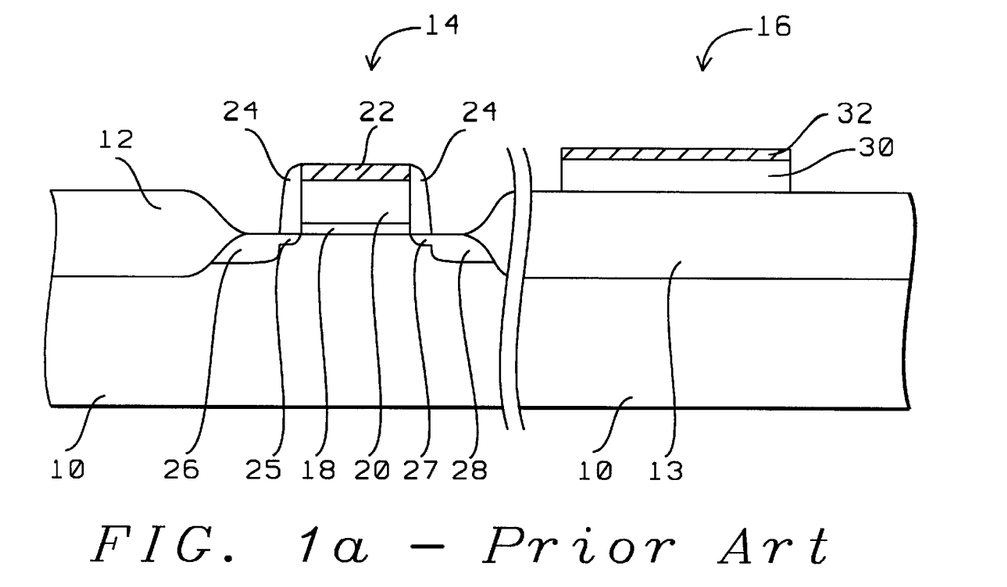
FIGS. 1a through 1c show a prior art method of creating a salicided polysilicon capacitor.
Figure 1B:
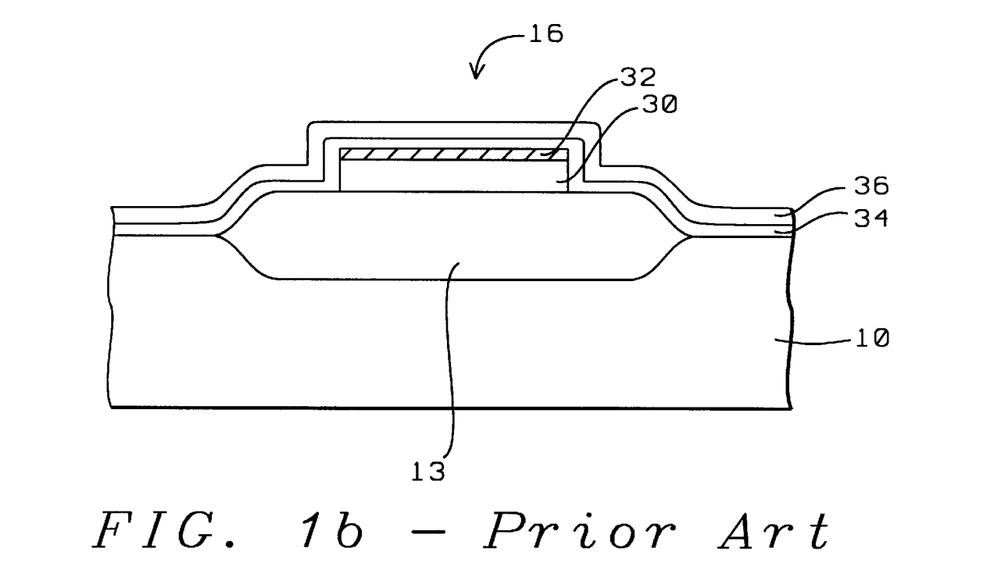
Figure 1C:
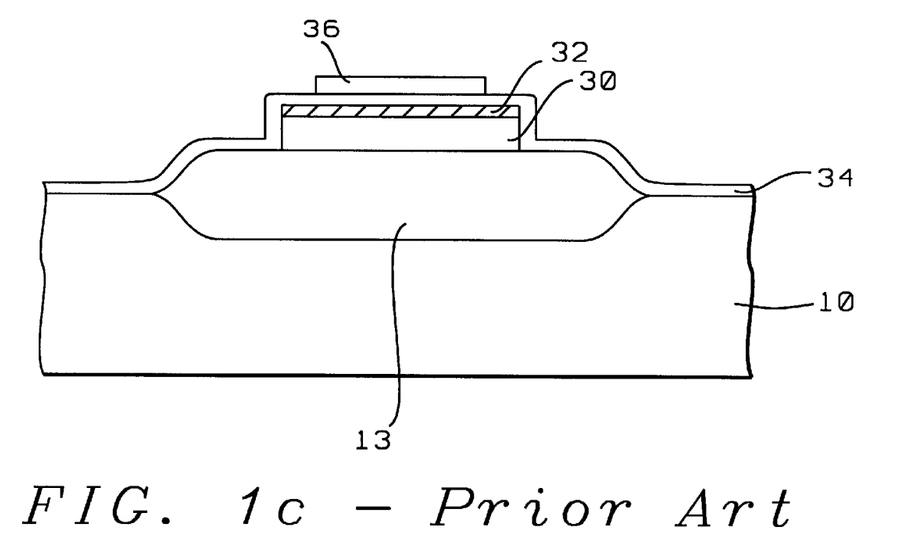

For purposes of processing efficiency it is desirable to integrate the creation of a capacitor as part of a DRAM cell with processing steps that form the overall DRAM cell. While the creation of the capacitor of the DRAM cell forms part of the overall processing stream, a number of these processing steps are dedicated to the creation of the capacitor of the DRAM cell. A prior art processing sequence that simultaneously creates a MOS gate electrode and a polycide to polysilicon capacitor is shown in FIGS. 1a through 1c. Active surface regions in the surface of substrate 10 are defined by means of the field oxide insulation regions 12 and 13, FIG. 1a. The gate electrode 14 is formed of a layer 20 of polysilicon overlying a layer 18 of pad oxide, the top layer 22 is a salicided layer for reduced contact resistance with the gate electrode 14. Source region 26 and drain region 28 impurity implants (comprising LDD regions 25 and 27 respectively) have been provided in the surface of substrate 10 as have gate spacers 24 for improved insulation of the gate electrode 14.

It is well known in the art that, to reduce contact resistance with the points of electrical contact of the gate electrode, these contact regions are salicided. This is accomplished by forming a silicide film of a metal that has a high melting point on these surfaces. A titanium silicide film is frequently used as a high melting point silicide film while cobalt silicide and nickel silicide film have also been investigated. The basic success of forming salicided contact layers can be achieved due to the fact that certain metals, such as titanium or cobalt, react when heated while they are in contact with silicon. This reaction forms conductive suicides over the surface of the silicon while the metal however does not react with silicon oxides. By forming silicon oxide spacers on the sidewalls of the gate electrode, the deposited metal does not interact with the sidewalls of the gate electrode and separate points of electrical contact can be formed for the source/drain regions and the surface of the gate electrode.

Referring back to FIG. 1a, capacitor 16 is being formed on the surface of the field oxide isolation region 13. The lower plate 30 of capacitor 16 is patterned at the same time at the gate electrode 20. Salicided layer 32 is formed at the same time that the salicided layer 22 is formed on the surface of gate electrode 14. Salicided layer 32 forms the bottom plate of the capacitor and is created following the same considerations that have previously been highlighted for the formation of layer 22.

Referring now to FIG. 1b, there is shown in cross section of capacitor 16 after consecutively a layer 34 of tetra-ethyl-ortho-silicate (TEOS) and a layer 36 of titanium nitride have been deposited over the surface of the isolation region 13 thereby including the surface of salicided layer 32.

From the cross section that is shown in FIG. 1c it can be concluded that prior art method of creating a capacitor as part of a DRAM cell comprises:

using salicided poly as the bottom plate of the capacitor, layer 32 of FIG. 1c using TEOS as the dielectric material for the capacitor, layer 34 of FIG. 1c using titanium nitride (TiN) for the top pate of the capacitor, layer 36 of FIG. 1c.

Problems are encountered with this method of creating the capacitor of the DRAM cell, these problems can be summarized as follows:

the etching of the upper layer 36 of TiN is a challenge in view of the need for a highly selective etch of layer 36 with respect to the underlying layer 34 of TEOS. Lack of this selectivity in etching layer 36 results in damage to the underlying layer 34 of TEOS, affecting the integrity of dielectric layer of the capacitor and therewith affecting the performance and reliability of the capacitor, and the process of salicidation that is applied for the creation of layer 32 is prone to leave salicided material in place; this material is typically difficult to completely remove from the surface in view of the metallic nature of the salicided material. The presence of these remnants, also referred to as salicide stringers since these remnant typically have the form of extended, thin metallic strings, is prone to cause electrical shorts through the deposited layer of TEOS, shorting the lower plate 32 with the upper plate 36.

The invention provides a method that eliminates the above highlighted disadvantages.

U.S. Pat. No. 6,110,791 (Kalnitsky et al.) shows a capacitor where the capacitor dielectric is etched away to form air gaps.

U.S. Pat. No. 6,140,200 (Eldridge) shows a method for a capacitor with air gaps.

U.S. Pat. No. 6,143,618 (Chen et al.), U.S. Pat. No. 6,124,199 (Gainbino et al.), U.S. Pat. No. 5,641,702 (Imai et al.) teach related capacitors.

SUMMARY OF THE INVENTION

A principle objective of the invention is to provide a method for the creation of a salicided polysilicon capacitor that avoids problems of differences of etch rates between an upper plate etch and the etch of the dielectric layer of the capacitor.

Another objective of the invention is to provide a method for the creation of a salicided polysilicon capacitor that uses a composite oxide for the dielectric of the capacitor, thereby achieving high capacitive value of the salicided polysilicon capacitor.

Another objective of the invention is to provide a method for the creation of a salicided polysilicon capacitor that creates a salicided polysilicon capacitor having a well-defined sidewall.

Another objective of the invention is to provide a method for the creation of a salicided polysilicon capacitor whereby an air gap is used to reduce edge leakage current in the capacitor.

Another objective of the invention is to provide a method for the creation of a salicided polysilicon capacitor whereby shorts between the capacitor plates are eliminated.

Another objective of the invention is to provide a method for the creation of a salicided polysilicon capacitor whereby salicided stringers are not created as part of the creation of the capacitor.

In accordance with the objectives of the invention a new method is provided for the creation of a salicided polysilicon capacitor. A salicided layer of polysilicon is created as the lower plate of a salicided polysilicon capacitor over the surface of a field isolation region. A layer of silicon nitride is deposited over the field oxide isolation region including the surface of the salicided polysilicon layer. A layer of TEOS is deposited over the surface of the layer of silicon nitride, a layer if titanium nitride is deposited over the surface of the layer of TEOS. The layer of TiN is etched after which the layer of TEOS is etched. The etch of the layer of TEOS is an overetch whereby TEOS is symmetrically removed from underneath the etched layer of TiN, leaving remnants of TEOS in place underneath the etched layer of TiN while at the same time creating air gaps underneath the etched layer of TiN. A layer of silane based oxide is deposited over the surface of the field oxide isolation region including the surface of the etched layer of TiN, thus enclosing the air gaps that have been created underneath the etched layer of TiN. The latter layer of silane based oxide is patterned and etched, forming the upper plate of the salicided polysilicon capacitor. The TEOS remnants remaining in place underneath the etched layer of TiN is part of the dielectric layer of the capacitor.

BRIEF DESCRIPTION OF THE DRAWINGS

FIGS. 2 through 5 address the invention, as follows:

DESCRIPTION OF THE PREFERRED EMBODIMENTS

Figure 2:
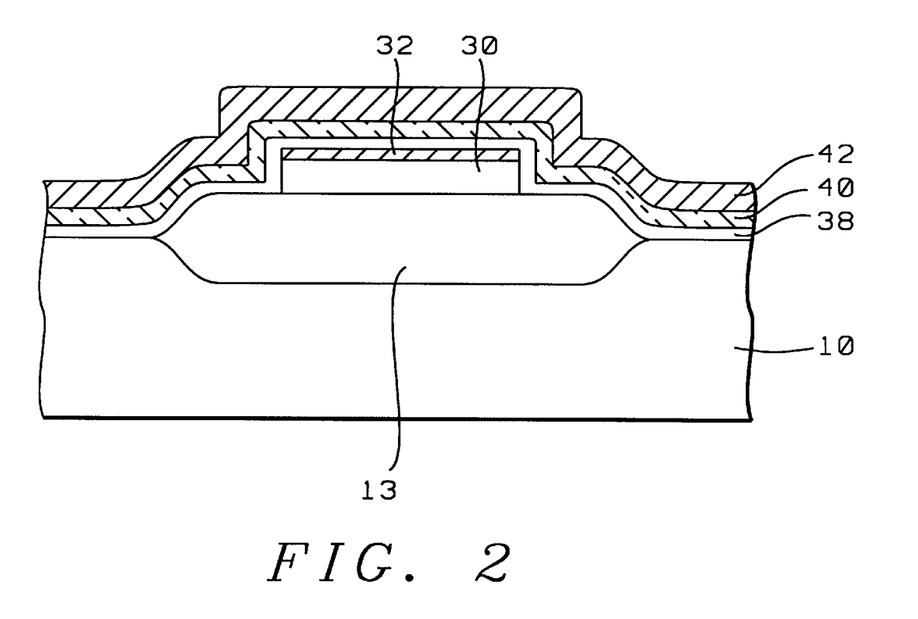
FIG. 2 shows a cross section of a field oxide isolation region that has been created on the surface of a substrate, an etched and salicided layer of polycide has been created on the surface of the field oxide isolation region, successive layers of silicon nitride, TEOS and titanium nitride have been deposited over the surface of the field oxide insulation region including the surface of the etched and salicided layer of polycide.

Referring now specifically to FIG. 2, there is shown a cross section of a semiconductor surface 10, preferably the surface of a silicon monocrystalline substrate, on the surface of which have been created:

13, a region of field oxide isolation

30, a patterned and etched layer of polycide

32, the salicided surface of the layer 30 of polycide

38, a layer of silicon nitride (SiN)

40, a layer of TEOS

42, a layer of titanium nitride (TiN).

Field oxide region 13 is created on the surface of substrate 10 for isolation purposes and is most typically used to separate p-channel devices (PMOS of PFET devices) from n-channel devices (NMOS or NFET devices). Field oxide regions are also created surrounding the CMOS devices for the creation of word lines or capacitive components on the surface thereof. Region 13 is created by initially growing a thin layer of silicon dioxide over the surface of substrate 10 via thermal oxidation after which a layer of silicon nitride is deposited over the surface of the layer of silicon dioxide. The layer of silicon nitride is deposited using methods of Low Pressure CVD (LPCVD) or Plasma Enhanced CVD (PECVD) to a thickness between about 50 and 200 Angstrom. Using methods of photolithography and Reactive Ion Etching (RIE) the pattern for the Field Oxide (FOX) regions is defined on the surface of substrate 10, the layers of silicon nitride and silicon dioxide are removed from above the surface of the substrate where the FOX regions have to be created. After removal of the patterned layer of photoresist that is used for the definition of the FOX regions by plasma oxygen ashing followed by careful wet cleaning of the surface of the substrate, the exposed surface of the substrate 10 is converted to FOX regions by exposing this surface to an oxygen rich environment. FOX region 13 is typically grown to a thickness between about 3000 and 5000 Angstrom in the surface regions of the substrate that are not protected by the patterned silicon nitride-silicon dioxide layers. After the FOX region has been grown, the silicon nitride layer is removed on a hot phosphoric acid solution. The layer of silicon dioxide can be removed using a dilute hydrofluoric (HF) acid solution consisting of 50 parts $H_2O$ and one part HF. The creation of layer 30 of polysilicon is typically part of and occurs at the same time that a polysilicon gate structure is created. The creation of layer 30 can be preceded by growing a layer of pad oxide over the surface of the FOX region 13. The layer 30 of polysilicon can be deposited using methods of LPCVD at a temperature of between about 500 and 650 degrees C. to a thickness between about 2000 and 4000 Angstrom. The polysilicon layer 30 can be grown using in situ doping procedures by doping with arsine or phosphine in a saline ambient. The polysilicon layer 30 can also be deposited intrinsically and doped via impurity ion implant of arsenic or phosphorous, at an energy of about 30 to 75 KeV and a concentration between about $5E14$ and $1E16$ atoms/cm$^2$. Photolithographic and RIE processing are used to create the polysilicon structure 30 shown in cross section in FIG. 2. After these processes have been completed, the patterned and etched layer of photoresist is removed using plasma oxygen ashing followed by a thorough wet clean of the surface.

The surface of the patterned layer 30 of polysilicon can salicided by depositing a layer of for instance titanium over the surface of the FOX region 13 including the surface of the patterned and etched layer 30 of polysilicon. The layer of titanium can be deposited using rf sputter procedures to a thickness between about 300 and 450 angstrom. By annealing this layer of titanium silicide a thin layer 32 of titanium silicide (TiSi$_2$) is formed over the layer 30 of polysilicon.

The process of annealing can be a rapid thermal anneal in a temperature range of between 600 and 700 degrees C. for a time of between 20 and 40 seconds in a nitrogen ambient followed by a rapid thermal anneal in a temperature of between about 800 and 900 degrees C. for a time between 20 and 40 seconds also in a nitrogen ambient. After the anneal process has been completed, the unreacted titanium silicide is removed from the surface of the FOX region 13 and the sidewalls of layer 30 of poly using a 1:1:1 solution of $NH_4OH$—$H_2O_2$—$H_2O$ at a temperature of about 25 degrees C. for a time of about 30 minutes. This process leaves titanium silicide on the surface of the polysilicon layer 30.

It must be realized that this process of removing unreacted salicide stringers from the surface lends itself to incomplete removal of these metallic, salicide stringers, as previously pointed out. These incompletely removed stringers are a potential source of electrical shorts between the various layers of a construct and are therefore to be avoided or, if this is not possible, must be prevented from causing any shorts within the construct. Shorts that can be caused by salicide stringers between the two electrodes of a capacitor are of special concern to the invention.

Next layer 38 of silicon nitride (Si$_3$N$_4$) is deposited using LPCVD or PECVD procedures at a pressure between about 200 mTorr and 400 mTorr, at a temperature between about 600 and 800 degrees C., to a thickness of about 100 and 500 Angstrom using NH$_3$ and SiH$_4$ or SiCl$_2$H$_2$. The silicon nitride layer 38 can also be deposited using LPCVD or PECVD procedures using a reactant gas mixture such as dichlorosilane (SiCl$_2$H$_2$) as a silicon source material and ammonia (NH$_3$) as a nitrogen source, at a temperature between about 600 and 800 degrees C., at a pressure between about 300 mTorr and 400 mTorr, to a thickness between about 100 and 500 Angstrom.

The deposition of layer 38 of SiN is followed by the deposition of layer 40 of TEOS. The preferred processing conditions for the deposition of layer 40 of TEOS are as follows: source: TEOS, flow rate between about 80 and 100 sccm, temperature between about 680 and 730 degrees C., pressure between about 240 and 260 mTorr, processing chamber used: an LP system, time of deposition about 60 minutes. The thickness to which the layer 40 of TEOS is deposited is determined by the dielectric requirements of the capacitor that is to be created, the indicated time of deposition may therefore accordingly have to be adjusted. A typical thickness for layer 28 of TEOS is between about 200 and 500 Angstrom.

After the layer 40 of TEOS has been deposited, layer 42 of TiN is deposited over the surface of layer 40. Layer 42 can be deposited using methods of CVD, at a temperature of between about 500 and 700 degrees C. to a thickness of between about 300 and 1000 Angstrom.

Figure 3:
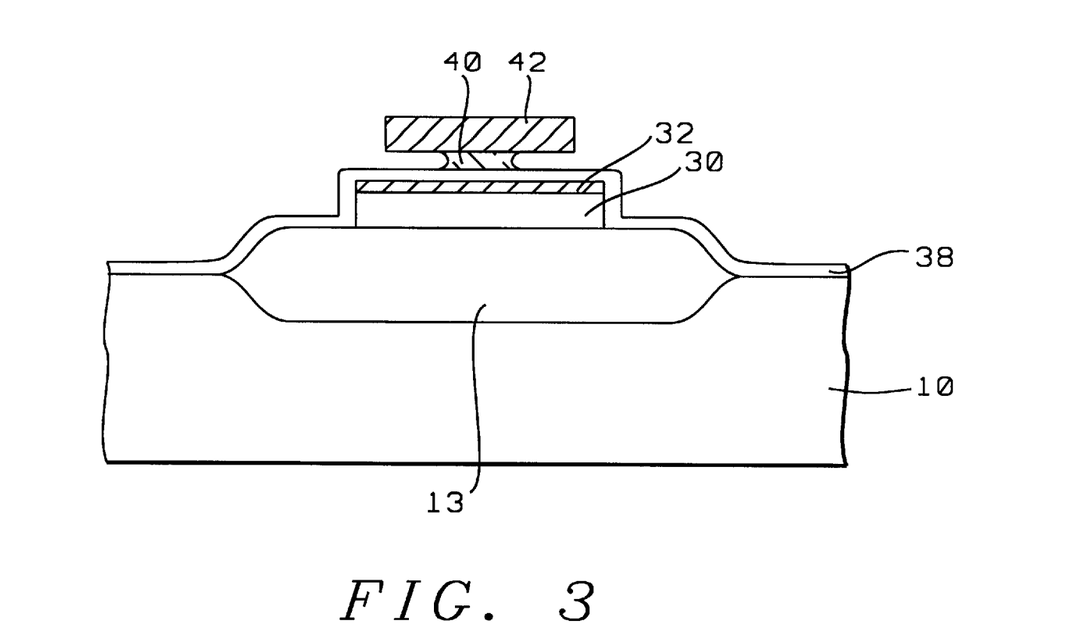
FIG. 3 shows a cross section after the layers of titanium nitride and TEOS have been patterned and etched.

FIG. 3 shows a cross section of the semiconductor surface 10 after the thereupon deposited layers 40 of TEOS and 42 of TiN have been etched. The cross section that is shown in FIG. 3 shows that the layer 42 of TiN that remains in place is aligned with the salicided surface 32 of the polysilicon layer 30 while layer 40 of TEOS has been significantly removed from underneath the patterned layer 42 of TiN.

Layer 42 of titanium nitride can be etched using anisotropic etching with an etchant gas of one of the group of CF$_4$, CHF$_3$, CHCl$_3$, CCl$_4$, BCl$_4$ and Cl$_2$ at a temperature between about 100 and 200 degrees C.

The preferred etching conditions for the etch of layer 40 are of TEOS are as follows: etchant gas: CF$_4$ or CHF$_3$ at a flow rate of about 15 sccm, gas pressure about 800 mTorr, rf power density about 400 Watts, no magnetic field applied, wafer temperature about −17 degrees C., time of the etch about 10 seconds. It is significant to note that layer 38 of silicon nitride forms the etch stop layer for the etch of TEOS layer 40.

After the layer 40 of TEOS has been etched, the layer of photoresist (not shown) that has been used for the etching of layers 40 and 42 is removed from the surface of the etched layer 28 of TEOS using conventional methods of ashing and a selective wet clean of the surface.

Figure 4:
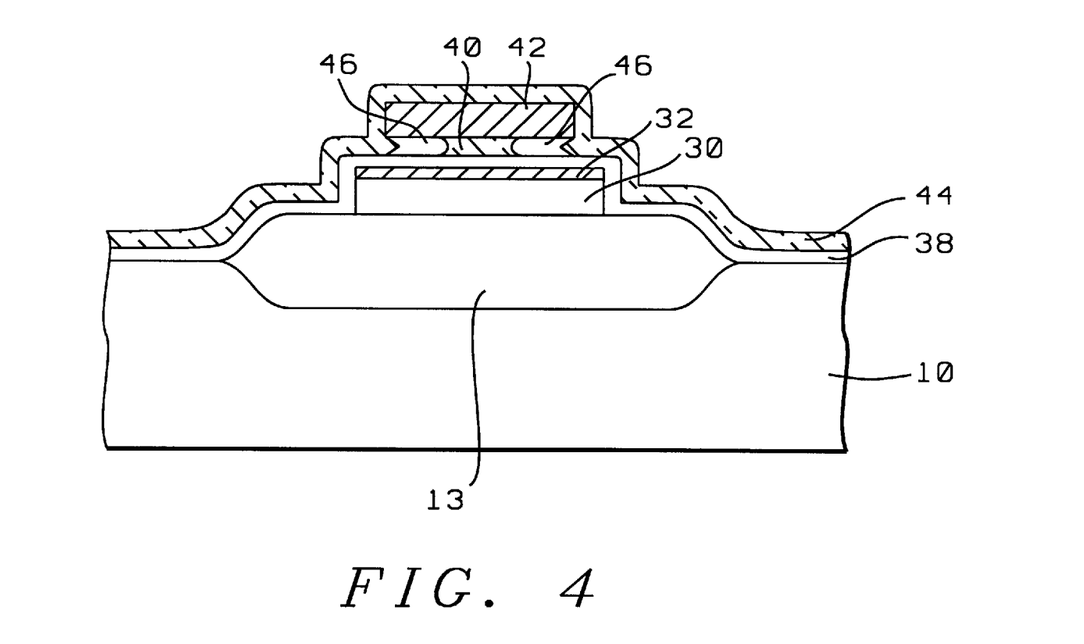
FIG. 4 shows a cross section after a layer of silane based oxide has been deposited over the surface of the field oxide isolation region, including the surface of the etched layer of titanium nitride.

The cross section that is shown in FIG. 4 shows the deposition of a silane ($SiH_4$) based layer 44 over the surface of the structure that is shown in cross section in FIG. 3.

The preferred processing conditions for the deposition of layer 44 of silane base oxide are as follows: source: $SiH_4$, flow rate between about 80 and 100 sccm, temperature between about 680 and 730 degrees C., pressure between about 240 and 260 mTorr, processing chamber used: an LP system, time of deposition about 60 minutes. The thickness to which the layer 40 of TEOS is deposited is influenced by the dielectric requirements of the capacitor that is to be created, the indicated time of deposition may therefore accordingly have to be adjusted. A typical thickness for layer 28 of TEOS is between about 200 and 500 Angstrom.

After the structure that is shown in cross section in FIG. 3 has been completed, the surface is subjected to a thorough cleaning. This thorough cleaning can be part of the removal of the layer of photoresist that has been used for the etch processing steps of etching layer 42 and 40. A layer of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

Figure 5:
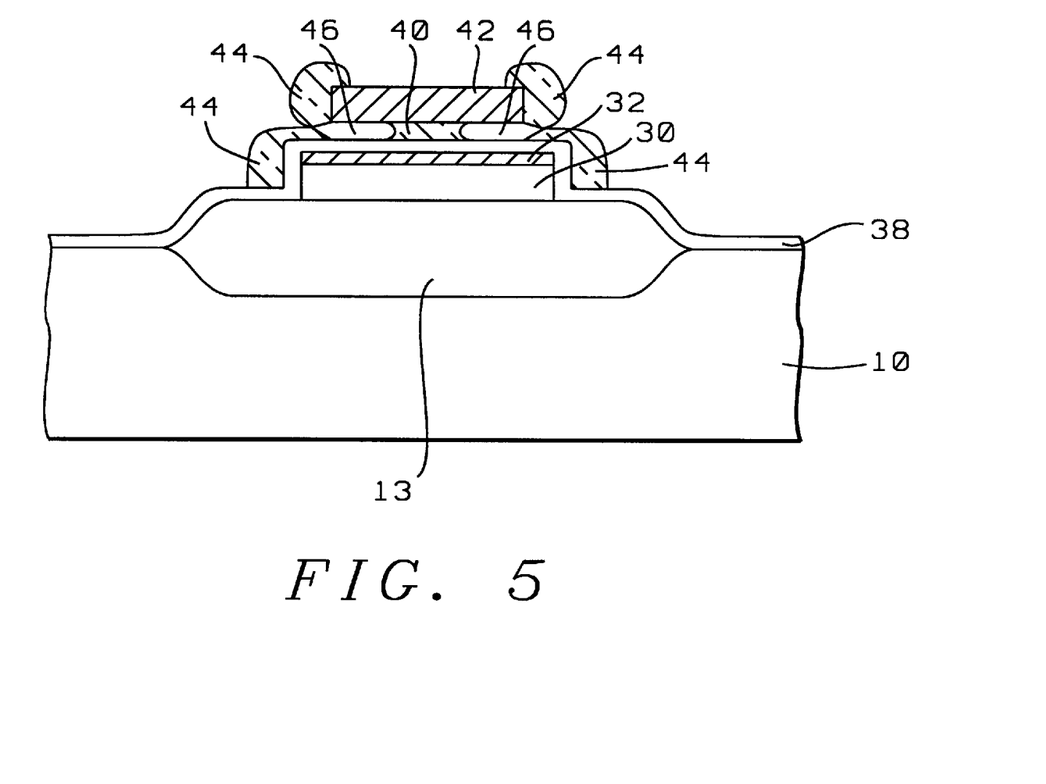
FIG. 5 shows a cross section after the deposited layer of silane based oxide has been patterned and etched, further closing up the air gaps created underneath the patterned layer if titanium nitride and creating access to the top plate of the salicided polysilicon capacitor of the invention.

The value of the previously indicated over etch of layer 40 of TEOS is apparent from the cross section that is shown in FIG. 4, that is the layer 44 seals off openings 46 underneath the patterned layer 42 of TiN. This effect becomes even more apparent from the cross section that is shown in FIG. 5, which is a cross section after the layer 44 of silane based oxide has been etched to create access to the second electrode 42 of the capacitor. From the cross section that is shown in FIG. 5, it is apparent that the silane based oxide of layer 44 has further contracted in the interface between the second electrode 42 of the capacitor and the layer 38 of silicon nitride where these regions are furthest removed from the remaining layer 40 of TEOS. This further contraction has in fact more firmly closed of the air spaces 46 between the first electrode 32 and the second electrode 42 of the capacitor.

The processing conditions for the etch of layer 44 of silane based oxide are as follow: etchant gas applied: chlorine provided at a flow rate of about 100 to 200 sccm, a gas pressure of about 10 mTorr, rf power density of about 300 to 400 Watts with no magnetic field applied, a wafer temperature of about 50 to 70 degrees C., with an etch time of about 30 to 80 seconds.

The invention, in the processing steps that have been highlighted in FIGS. 2 through 5, provides the following advantages:

the layer of etch stop for the creation of an access point to the second electrode of the capacitor is a layer of silicon nitride which assures a high etch selectivity between this layer if silicon nitride and the layer of silane based oxide that is used to create access to the second electrode of the capacitor the layer 40 is a layer of TEOS which is a composite oxide, resulting in a high-k dielectric that is being used for the dielectric of the capacitor resulting in a high capacitive value for the capacitor the invention provides clean sidewalls of the capacitor the capacitor of the invention has air gaps underneath the second electrode of the capacitor, these air gaps tend to reduce edge current leakage, and at no time during the processing steps of the invention can salicided stringers cause shorts between the first and the second electrode of the capacitor.

No salicide stringers are likely to be created at this time in view of the following: salicide stringers would be caused by the etch of layer 42 if salicide is exposed. Where however the etch selectivity between oxide and nitride is high, there is no possibility of exposing the salicide during subsequent etching and cleaning.

It must further be observed that the size of air gap 46, FIG. 4, is very small compared with the size of the capacitor area. Therefore, although additional TEOS would result in an increased value of capacitance, the amount of TEOS that is deposited has insignificant impact on the final value of the capacitance.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a salicided polysilicon to metal capacitor as part of a semiconductor device, comprising the steps of:

providing a semiconductor substrate as a base for the salicided polysilicon to metal capacitor, an isolation region of field oxide having been provided on the surface of the substrate;

forming a layer of polysilicon on the surface of the region of field oxide, patterning and etching said layer of polysilicon, forming a patterned layer of polysilicon overlying said layer of field oxide;

saliciding the surface of the patterned and etched layer of polysilicon, forming a first conductor element;

depositing a layer of etch stop material over the surface of the region of field oxide, including the surface of the salicided layer of polysilicon;

depositing a layer of dielectric over the surface of the layer of etch stop material;

depositing a layer of. refractory metal over the surface of the layer of dielectric;

etching said layer of refractory metal, creating a pattern of refractory metal, said pattern of refractory metal aligning with said patterned and etched layer of polysilicon;

etching said layer of dielectric down to the layer of etch stop material using said patterned layer of refractory metal as a mask, partially exposing the surface of said etch stop layer, partially removing said layer of dielectric from underneath said pattern of refractory metal;

cleaning the surface of the pattern of refractory metal and the surface of said partially exposed etch stop layer;

depositing a layer of silane based oxide over the surface of said pattern of refractory metal and the surface of said partially exposed etch stop layer, enclosing areas underneath said pattern of refractory metal from which said layer of dielectric has been partially removed; and etching said layer of silane based oxide, partially exposing the surface of said pattern of refractory metal creating a second conductor element, partially exposing the surface of said layer of etch stop material, thereby further enclosing areas underneath said pattern of refractory metal from which said layer of dielectric has been partially removed.

2. The method of claim 1 wherein said etch stop material comprises silicon nitride, deposited to a thickness of between about 100 and 500 Angstrom.

3. The method of claim 1 wherein said layer of dielectric comprises tetra-ethyl-ortho-silicate (TEOS), deposited to a thickness of between about 200 and 500 Angstrom.

4. The method of claim 1 wherein said layer of refractory metal comprises titanium nitride, deposited to a thickness of between about 300 and 1000 Angstrom.

5. The method of claim 1 wherein said layer of silane based oxide comprises $SiH_4$ based oxide, deposited to a thickness of between about 200 and 500 Angstrom.

6. The method of claim 1 wherein said layer of polysilicon is deposited using methods of LPCVD at a temperature of between about 500 and 650 degrees C. to a thickness between about 2000 and 4000 Angstrom.

7. The method of claim 1 wherein said layer of polysilicon is deposited intrinsically and doped via impurity ion implant of arsenic or phosphorous, at an energy of about 30 to 75 KeV and a concentration between about 5E14 and 1E16 atoms/$cm^2$.

8. The method of claim 1 wherein said saliciding the surface of the layer of polysilicon comprises:

depositing a layer titanium over the surface of the isolation region of field oxide region including the surface of the patterned and etched layer of polysilicon, using rf sputter procedures, deposited to a thickness between about 300 and 450 Angstrom; and annealing the deposited layer of titanium, forming a thin layer of titanium silicide ($TiSi_2$) over the layer of polysilicon, by a rapid thermal anneal in a temperature range of between 600 and 700 degrees C. for a time of between 20 and 40 seconds in a nitrogen ambient.

9. The method of claim 8 with the additional step of removing unreacted titanium silicide from the surface of the field oxide isolation region and the sidewalls of the layer of patterned and etched poly using a 1:1:1 solution of $NH_4OH$—$H_2O_2$—$H_2O$ at a temperature of about 25 degrees C. for a time of about 30 minutes.

10. The method of claim 1, further comprising the steps of:

connecting said first conductor element to elements of an integrated circuit in the semiconductor device; and connecting said second conductor element to elements of an integrated circuit in the semiconductor device.

11. The method of claim 1 wherein said semiconductor substrate has been provided with semiconductor device structures such as gate electrodes and source and drain regions.

12. The method of claim 1 wherein said semiconductor substrate has been provided with semiconductor device structures such as gate electrodes and source and drain regions and multiple levels of interconnect lines.

13. A method of forming a salicided polysilicon to metal capacitor as part of a semiconductor device, comprising the steps of:

providing a semiconductor substrate as the base for the salicided polysilicon to metal capacitor, an isolation region of field oxide having been provided on the surface of the substrate;

forming a layer of polysilicon on the surface of the region of field oxide, patterning and etching said layer of polysilicon, forming a patterned layer of polysilicon overlying said layer of field oxide having been provided on the surface of the substrate;

saliciding the surface of the patterned and etched layer of polysilicon, forming a first conductor element;

depositing a layer of silicon nitride over the surface of the region of field oxide, including the surface of the salicided layer of polysilicon;

depositing a layer of tetra-ethyl-ortho-silicate (TEOS) over the surface of the layer of etch stop material;

depositing a layer of titanium nitride over the surface of the layer of dielectric;

etching said layer of titanium nitride, creating a pattern of titanium nitride, said pattern of titanium nitride aligning with said patterned and etched layer of polysilicon;

etching said layer of tetra-ethyl-ortho-silicate down to the layer of silicon nitride using said pattern of titanium nitride as a mask, partially exposing the surface of said layer of silicon nitride, partially removing said layer of tetra-ethyl-ortho-silicate from underneath said pattern of titanium nitride;

cleaning the surface of the pattern of titanium nitride and the surface of said partially exposed layer of silicon nitride;

depositing a layer of silane based oxide over the surface of said pattern of titanium nitride and the surface of said partially exposed layer of silicon nitride, enclosing areas underneath said pattern of titanium nitride from which said layer of tetra-ethyl-ortho-silicate has been partially removed; and etching said layer of silane based oxide, partially exposing the surface of said pattern of titanium nitride creating a second conductor element, further partially exposing the surface of said layer of silicon nitride, thereby further completing enclosing areas underneath said pattern of titanium nitride from which said layer of tetra-ethyl-ortho-silicate has been partially removed.

14. The method of claim 13 wherein said layer of silicon nitride is deposited to a thickness of between about 100 and 500 Angstrom.

15. The method of claim 13 wherein said layer of tetra-ethyl-ortho-silicate (TEOS) is deposited to a thickness of between about 200 and 500 Angstrom.

16. The method of claim 13 wherein said layer of titanium nitride is deposited to a thickness of between about 300 and 1000 Angstrom.

17. The method of claim 13 wherein said layer of silane based oxide comprises $SiH_4$ based oxide, deposited to a thickness of between about 200 and 500 Angstrom.

18. The method of claim 13 wherein said layer of polysilicon is deposited using methods of LPCVD at a temperature of between about 500 and 650 degrees C. to a thickness between about 2000 and 4000 Angstrom.

19. The method of claim 13 wherein said layer of polysilicon is deposited intrinsically and doped via impurity ion implant of arsenic or phosphorous, at an energy of about 30 to 75 KeV and a concentration between about 5E14 and 1E16 atoms/cm$^2$.

20. The method of claim 13 wherein said saliciding the surface of the layer of polysilicon comprises:

depositing a layer titanium over the surface of the isolation region of field oxide region including the surface of the patterned and etched layer of polysilicon, using rf sputter procedures, deposited to a thickness between about 300 and 450 Angstrom; and annealing the deposited layer of titanium, forming a thin layer of titanium silicide (TiSi$_2$) over the layer of polysilicon, by a rapid thermal anneal in a temperature range of between 600 and 700 degrees C. for a time of between 20 and 40 seconds in a nitrogen ambient.

21. The method of claim 20 with the additional step of removing unreacted titanium silicide from the surface of the field oxide isolation region and the sidewalls of the layer of patterned and etched poly using a 1:1:1 solution of NH$_4$OH—H$_2$O$_2$—H$_2$O at a temperature of about 25 degrees C. for a time of about 30 minutes.

22. The method of claim 13, further comprising the steps of:

connecting said first conductor element to elements of an integrated circuit in the semiconductor device; and connecting said second conductor element to elements of an integrated circuit in the semiconductor device.

23. The method of claim 13 wherein said semiconductor substrate has been provided with semiconductor device structures such as gate electrodes and source and drain regions.

24. The method of claim 13 wherein said semiconductor substrate has been provided with semiconductor device structures such as gate electrodes and source and drain regions and multiple levels of interconnect lines.

* * * * *